(12) United States Patent
Cho et al.

(10) Patent No.: US 10,038,433 B2
(45) Date of Patent: Jul. 31, 2018

(54) DEVICE FOR CORRECTING MULTI-PHASE CLOCK SIGNAL

(71) Applicants: SK Hynix Inc., Icheon (KR); Korea University Research and Business Foundation, Seoul (KR)

(72) Inventors: Jeong Cho, Busan (KR); Soowon Kim, Seoul (KR); Jinhoon Hyun, Seoul (KR); Chanhui Jeong, Gwangju (KR); Daehan Kwon, Seoul (KR)

(73) Assignees: SK HYNIX INC., Icheon (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 15/468,025

(22) Filed: Mar. 23, 2017

(65) Prior Publication Data

US 2017/0288656 A1    Oct. 5, 2017

(30) Foreign Application Priority Data

Apr. 1, 2016  (KR) .......................... 10-2016-0040053

(51) Int. Cl.
*H03K 3/017*    (2006.01)
*H03K 5/04*    (2006.01)
(Continued)

(52) U.S. Cl.
CPC ....... *H03K 5/1565* (2013.01); *H03K 5/15013* (2013.01)

(58) Field of Classification Search
CPC .... H03K 5/15; H03K 5/15013; H03K 5/1502; H03K 5/15026; H03K 5/15033;
(Continued)

(56) References Cited

U.S. PATENT DOCUMENTS 7,619,456 B2 *  11/2009  Kim .................. H03K 5/15013
                                                      327/161
2009/0289680 A1    11/2009  Miyano

FOREIGN PATENT DOCUMENTS

KR    10-2005-0020491 A    3/2005

OTHER PUBLICATIONS

Chung et al., "High-Resolution All-Digital Duty-Cycle Corrector in 65-nm CMOS technology", IEEE Transactions on Very Large Scale Integration (VLSI) Systems, May 2014, pp. 1096-1105, vol. 22, No. 5, IEEE.

(Continued)

*Primary Examiner* — Lincoln Donovan
*Assistant Examiner* — Diana J Cheng

(57) ABSTRACT

A device for correcting a multi-phase clock signal includes a first duty ratio adjusting circuit (DRAC) to adjust a duty ratio of a first clock signal; a variable delay line (VDL) delaying a second clock signal; a second DRAC adjusting a duty ratio of the VDL output; first and second differential clock generating circuits (DFCGs) generating differential signals from first and second DRAC outputs, respectively; an edge combining circuit combining edges of outputs from the DFCGs; a duty ratio detecting circuit (DRDC) detecting a duty ratio of a first DRAC output or a first DFCG output in a first mode and of an edge combining circuit output in a second mode; a first control circuit controlling the first and second DRACs using a DRDC output in the first mode; and a second control circuit controlling the VDL using the DRDC output in the second mode.

20 Claims, 12 Drawing Sheets

(51) Int. Cl.
  *H03K 7/08* (2006.01)
  *H03K 5/156* (2006.01)
  *H03K 5/15* (2006.01)

(58) Field of Classification Search
  CPC .............. H03K 5/1504; H03K 5/15046; H03K 5/1506; H03K 5/15066; H03K 5/15073; H03K 5/1508; H03K 5/151; H03K 5/156; H03K 5/1565
  USPC .................................................. 327/172, 175
  See application file for complete search history.

(56) References Cited

OTHER PUBLICATIONS

Min et al., "A 0.31-1 GHz Fast-Corrected Duty-Cycle Corrector With Successice Approximation Register for DDR DRAM Applications", IEEE Transactions on Very Large Scale Integration (VLSI) Systems, Aug. 2012, pp. 1524-1528, vol. 20, No. 5, IEEE.

Su et al., "Delay-Line Based Fast-Locking All-Digital Pulsewidth-Control Circuit with Programmable Duty Cycle", IEEE Asian Solid-State Circuits Cinference, Nov. 12-14, 2012, pp. 305-308, IEEE, Kobe, Japan.

Ha et al., "Unified all-digital duty-cycle and phase correction circuit for QDR I/O interface", Electronics Letters, Oct. 23, 2008, pp. 1300-1301, vol. 44, No. 22.

Dehng et al., "Clock-Deskew Buffer Using a SAR-Controlled Delay-Locked Loop", IEEE Journal of Solid-State Circuits, Aug. 2000, pp. 1128-1136, vol. 35, No. 8, IEEE.

Agarwal et al., "A duty-Cycle Correction Circuit for High-Frequency Clocks", 2006 Symposium on VLSI Circuits Digest of Techinical Papers, 2006, pp. 106-107, IEEE.

Chen et al., "A Low Power Wide Range Duty Cycle Corrector Based on Pulse Shrinking/Stretching Mechanism", IEEE Asian Solid-State Circuits Conference, Nov. 12-17, 2007, pp. 460-463, IEEE, Jeju, Korea.

Cheng et al., "A High Linearity, Fast-Locking Pulsewidth Control Loop With Digitally Programmable Duty Cycle Correction for Wide Range Operation", IEEE Journal of Solid-State Circuits, Feb. 2008, pp. 399-413, IEEE.

Song et al., "A Single-Loop DLL Using an OR-AND Duty-Cycle Correction Technique", IEEE Asian Solid-State Circuits Conference, Nov. 3-5, 2008, pp. 245-248, IEEE, Fukuoka, Japan.

Shin et al., "Wide-Range Fast-Lock Duty-Cycle Corrector with Offset-Tolerant Duty-Cycle Detection Scheme for 54nm 7Gb/s GDDR5 DRAM Interface", 2009 Symposium on VLSI Circuits Digest of Technical Papers, Jun. 2009, pp. 138-139.

Lee et al., "A 1.35 V 5.0 Gb/s/pin GDDR5M with 5.4 mW Standby Power and an Error-Adaptive Duty-Cycle Corrector", ISSCC 2014/ Session25/High-Bandwidth Low-Power DRAM and I/O / 25.3, 2014 IEEE International Solid-State Circuits Conference, 2014, pp. 434-435, IEEE.

Nam et al., "An All-Digital CMOS Duty Cycle Correction Circuit with a Duty-Cycle Correction Range of 15-to85% for Multi-Phase Applications", IEICE Trans. Electron., Apr. 2005, pp. 773-777, vol. E88-C, No. 4, IEICE.

* cited by examiner

DEVICE FOR CORRECTING MULTI-PHASE CLOCK SIGNAL

CROSS-REFERENCE TO RELATED APPLICATIONS

The present application claims priority to Korean Patent Application No. 10-2016-0040053, filed on Apr. 1, 2016, which is incorporated herein by reference in its entirety.

BACKGROUND

1. Field

Exemplary embodiments of the present invention relate to a device for correcting a multi-phase clock signal, and more particularly, to a device for correcting a multi-phase clock signal capable of correcting a duty ratio and phases of the multi-phase clock signal.

2. Description of the Related Art

As the operating voltage of a semiconductor device decrease and the operating frequency of the semiconductor device increase, it is required to generate a high frequency clock signal at a low voltage.

When the reference clock signal is simply divided to generate the low voltage high frequency clock signal, there is a problem that the pulse width of the final clock signal decreases and the quality of the clock signal deteriorates.

Recently, in order to solve such a problem, a method of generating a multi-phase clock signal with a uniform phase difference using a reference clock signal has been used.

For example, when a four-phase clock signal having phase differences of 90 degrees is generated using a reference clock signal, the same effect as generating a clock signal having a frequency of four times the reference clock signal frequency is obtained.

In this technique, it is essential to evenly control a duty ratio of a multi-phase clock signal and to evenly control the phase difference between the multi-phase clock signals.

SUMMARY

Various embodiments are directed to a device for correcting a multi-phase clock signal that is capable of correcting both a duty ratio and a phase of a multi-phase clock signal.

In an embodiment, a device for correcting multi-phase clock signal may comprise a first duty ratio adjusting circuit configured to adjust a duty ratio of a clock signal having a first phase; a variable delay line configured to variably delay a clock signal having a second phase; a second duty ratio adjusting circuit configured to adjust a duty ratio of an output of the variable delay line; a first differential clock generating circuit configured to generate a differential signal from an output of the first duty ratio adjusting circuit; a second differential clock generating circuit configured to generate a differential signal from an output of the second duty ratio adjusting circuit; an edge combining circuit configured to combine edges of signals output from the first differential clock generating circuit and the second differential clock generating circuit; a duty ratio detecting circuit configured to detect a duty ratio of either an output from the first duty ratio adjusting circuit or an output from the first differential clock generating circuit in the duty ratio correction mode and configured to detect a duty ratio of an output from the edge combining circuit in the phase correction mode; a first control circuit configured to control the first duty ratio adjusting circuit and the second duty ratio adjusting circuit in accordance with an output of the duty ratio detecting circuit in the duty ratio correction mode; and a second control circuit configured to control the variable delay line in accordance with an output of the duty ratio detecting circuit in the phase correction mode.

DETAILED DESCRIPTION

Hereafter, various embodiments will be described below in more detail with reference to the accompanying drawings.

Figure 1:
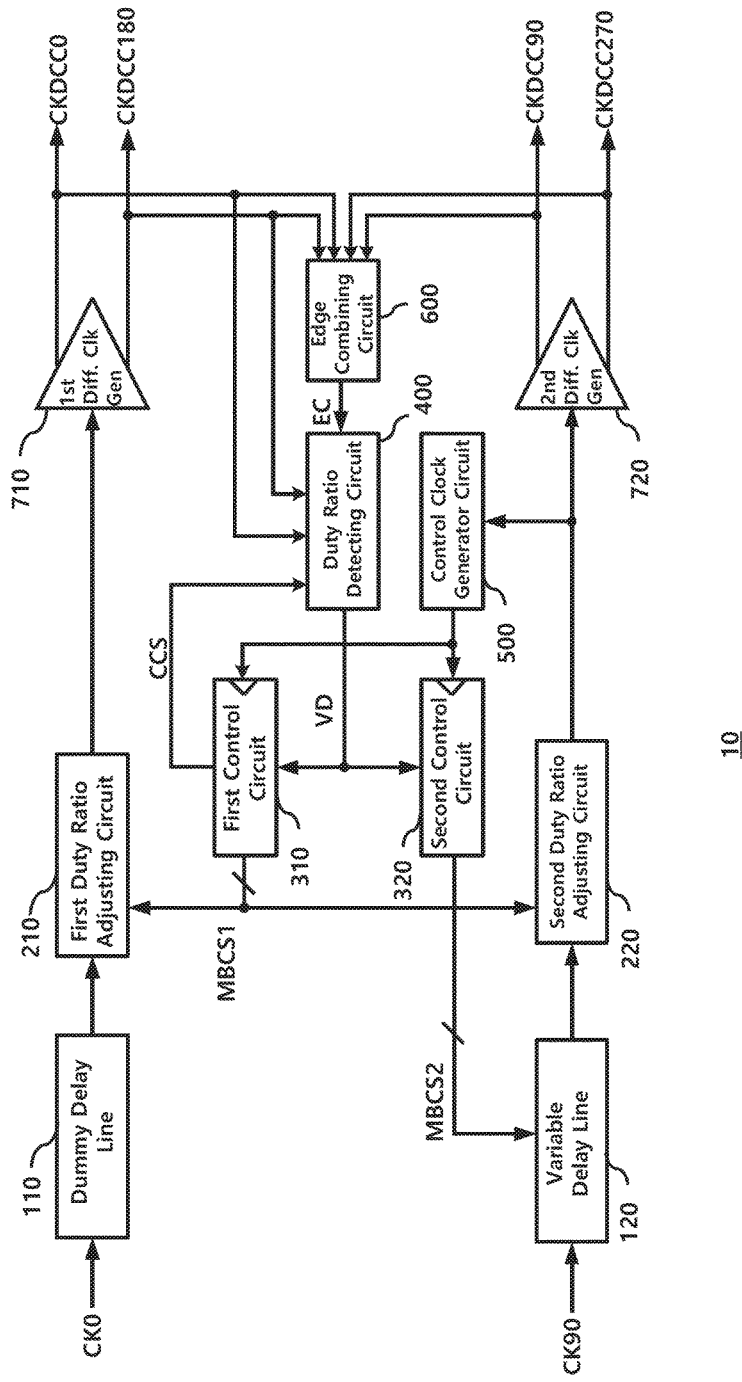
FIG. 1 is a diagram illustrating a device for correcting a multi-phase clock signal according to an embodiment.

FIG. 1 is a diagram illustrating a device 10 for correcting multi-phase clock signal according to an embodiment.

The device 10 for correcting multi-phase clock signal receives first and second input clock signals CK0 and CK90 having a phase difference of 90 degrees and outputs first to fourth output clock signals CKDCC0, CKDCC90, CKDCC180 and CKDCC270.

The device 10 for correcting a multi-phase clock signal includes a dummy delay line 110, a variable delay line 120, a first duty ratio adjusting circuit 210, a second duty ratio adjusting circuit 220, a first control circuit 310, a second control circuit 320, a duty ratio detecting circuit 400, a control clock generating circuit 500, an edge combining circuit 600, a first differential clock generating circuit 710, and a second differential clock generating circuit 720.

The dummy delay line 110 delays and outputs the first input clock CK0 and the variable delay line 120 delays and outputs the second input clock CK90.

In the embodiment, the delay amount of the dummy delay line 110 is fixed and the delay amount of the variable delay line 120 may be adjusted by the control of the second control circuit 320.

Various circuits for implementing the dummy delay line 110 and the variable delay line 120 are known, so detailed descriptions thereof will be omitted.

The first duty ratio adjusting circuit 210 adjusts the duty ratio of the clock signal output from the dummy delay line 110 under the control of the first control circuit 310. The second duty ratio adjusting circuit 220 adjusts the duty ratio of the clock signal output from the variable delay line 120 under the control of the second control circuit 320.

The first differential clock generating circuit 710 outputs a first output clock CKDCC0 and a third output clock CKDCC180 based on a clock signal output from the first duty ratio adjusting circuit 210. The third output clock CKDCC180 is 180 degrees out of phase from the first output clock CKDCC0.

In an embodiment, the first output clock CKDCC0 may be substantially the same as the output of the first duty ratio adjusting circuit 210.

The second differential clock generating circuit 720 outputs a second output clock CKDCC90 and a fourth output clock CKDCC270 based on a clock signal output from the second duty ratio adjusting circuit 220. The fourth output clock CKDCC270 is 180 degrees out of phase from the second output clock CKDCC90 with In an embodiment, the second output clock CKDCC90 may be substantially as same as the output of the second duty ratio adjusting circuit 220.

Since there are a variety of known circuits for implementing the first differential clock generating circuit 710 and the second differential clock generating circuit 720, detailed descriptions thereof will be omitted.

The edge combining circuit 600 outputs a clock signal EC combining the edges of the first through fourth output clocks.

The duty ratio detecting circuit 400 receives the outputs of the first differential clock generating circuit 710 and the clock signal EC output by the edge combining circuit 600. The duty ratio detecting circuit 400 detects the duty ratio of either the outputs of the first differential clock generating circuit 710 or the clock signal EC according to a completion signal CCS received from the first control circuit 310.

In the present embodiment, the duty ratio detecting circuit 400 outputs 1 on an output signal VD when the detected duty ratio is equal to or more than 50%, and outputs 0 on the output signal VD otherwise.

The control clock generating circuit 500 generates a control clock from the output of the second duty ratio adjusting circuit 220.

In this embodiment, the control clock generating circuit 500 divides the output of the second duty ratio adjusting circuit 220 by ½ and outputs the result as a control clock.

The specific circuit of the control clock generating circuit 500 may be obvious to those of ordinary skill in the art.

The first control circuit 310 and the second control circuit 320 generate respective control signals according to the output of the duty ratio detecting circuit 400 in synchronization with the control clock of the control clock generating circuit 500.

The output of the first control circuit 310 controls the first duty ratio adjusting circuit 210 and the second duty ratio adjusting circuit 220. The output of the second control circuit 320 controls the variable delay line 120.

In this embodiment, after the control operation of the first control circuit 310 is completed, the control operation of the second control circuit 320 is performed. The first control circuit 310 can, using a completion signal CCS, notify the duty ratio detecting circuit 400 that the control operation of the first control circuit 310 is completed.

The control operation of the first control circuit 310 corresponds to a duty ratio correcting operation and the control operation of the second control circuit 320 corresponds to a phase correction operation. The correction operation for the multi-phase clock signal can be completed through the two control operations.

The duty ratio detecting circuit 400 may detect the duty ratio of the first output clock CKDCC0 while controlling the first control circuit 310.

The duty ratio detecting circuit 400 receives the first output clock CKDCC0 and detects the duty ratio as described herein. However, as described above, since the first output clock CKDCC0 may be substantially the same as the output from the first duty ratio adjusting circuit 210, in an embodiment the duty ratio detecting circuit 400 may receive the output of the first duty ratio adjusting circuit 210 instead of the first output clock CKDCC0.

The duty ratio detecting circuit 400 may detect the duty ratio of the clock signal EC output from the edge combining circuit 600 while controlling the second control circuit 320.

The duty ratio detecting circuit 400 may use the third output clock CKDCC180 as a reference clock signal for duty ratio detection.

The construction and operation of the duty ratio detecting circuit 400 will be described in detail below.

Figure 2:
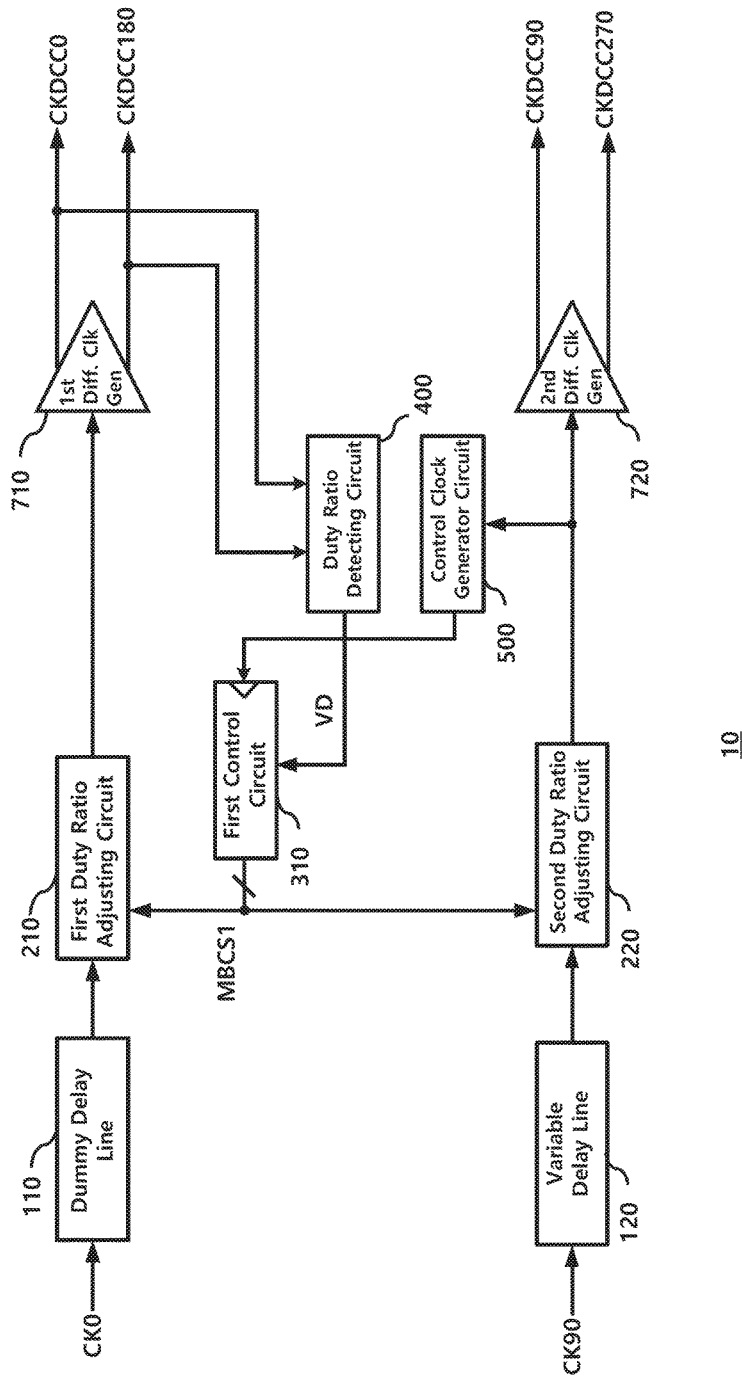
FIG. 2 is a diagram illustrating a duty ratio correcting operation according to an embodiment.

FIG. 2 is a diagram illustrating the duty ratio correction operation of the device 10 of FIG. 1.

The duty ratio correcting operation is an operation in which the first control circuit 310 controls the first duty ratio adjusting circuit 210 and the second duty ratio adjusting circuit 220.

The duty ratio detecting circuit 400 detects the duty ratio of the first output clock CKDCC0 and controls the first control circuit 310 using the output signal VD.

The duty ratio detecting circuit 400 may use the third output clock CKDCC180 as a reference clock to detect the duty ratio of the first output clock CKDCC0.

In the embodiment, the control clock generating circuit 500 generates a control clock by dividing the output of the second duty ratio adjusting circuit 220 by ½.

The first control circuit 310 can sequentially generate a first multi-bit control signal MBCS1 by referring to the duty ratio detected by the duty ratio detecting circuit 400 in synchronization with the control clock.

In this embodiment, the first control circuit 310 may be implemented using a 5-bit Successive Approximation Register (SAR).

Since the SAR is a well-known technology, the specific circuit of the first control circuit 310 is not described in this disclosure.

The control signal output from the first control circuit 310 controls the first duty ratio adjusting circuit 210 and the second duty ratio adjusting circuit 220 together.

The first control circuit 310 may generate a completion signal CCS and output the completion signal CCS to the duty ratio detecting circuit 400 when all the 5-bit control signals are determined.

Figure 3:
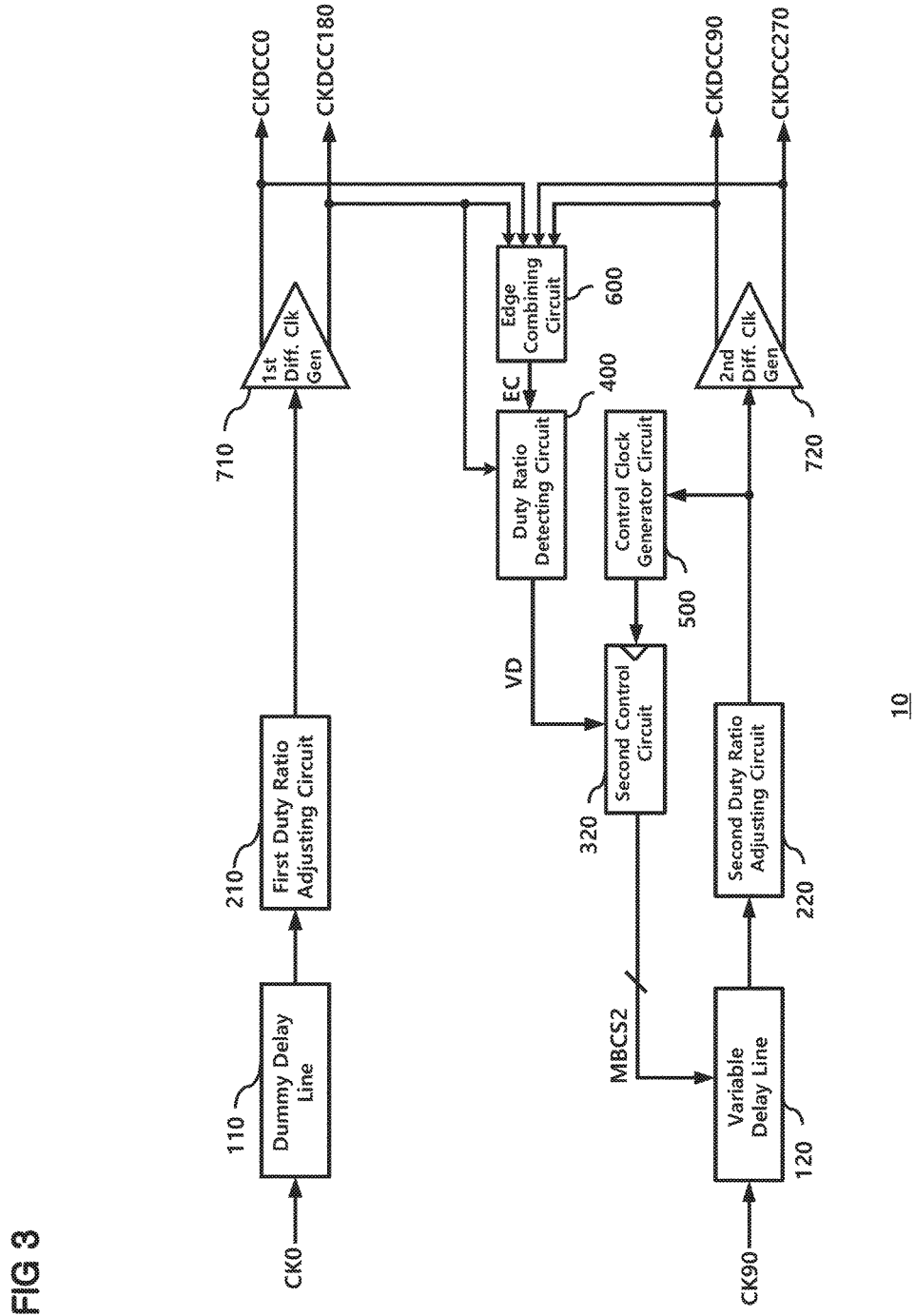
FIG. 3 is a diagram illustrating a phase correction operation according to an embodiment.

FIG. 3 is a block diagram illustrating the phase correction operation of the device 10 of FIG. 1.

In the phase correcting operation, the duty ratio detecting circuit 400 detects the duty ratio of the clock signal output from the edge combining circuit 600, rather than the first output clock CKDCC0.

The second control circuit 320 may generate a second multi-bit control signal MBCS2 according to the output signal VD of the duty ratio detecting circuit 400 in synchronization with the control clock output from the control clock generating circuit 500.

For example, the second control circuit 320 may be implemented using a 4-bit SAR. Since the SAR is a well-known technology, the specific circuit of the second control circuit 320 is not described in the disclosure.

The second multi-bit control signal MBCS2 output from the second control circuit 320 controls the variable delay line 120 to adjust the delay amount of the second input clock CK90.

When the duty ratio correcting operation and the phase correcting operation are sequentially performed as described above, the duty ratios of the first through fourth output clocks are kept constant and become a multi-phase clock signal having a phase difference of 90 degrees between adjacent clock signals.

Figure 4:
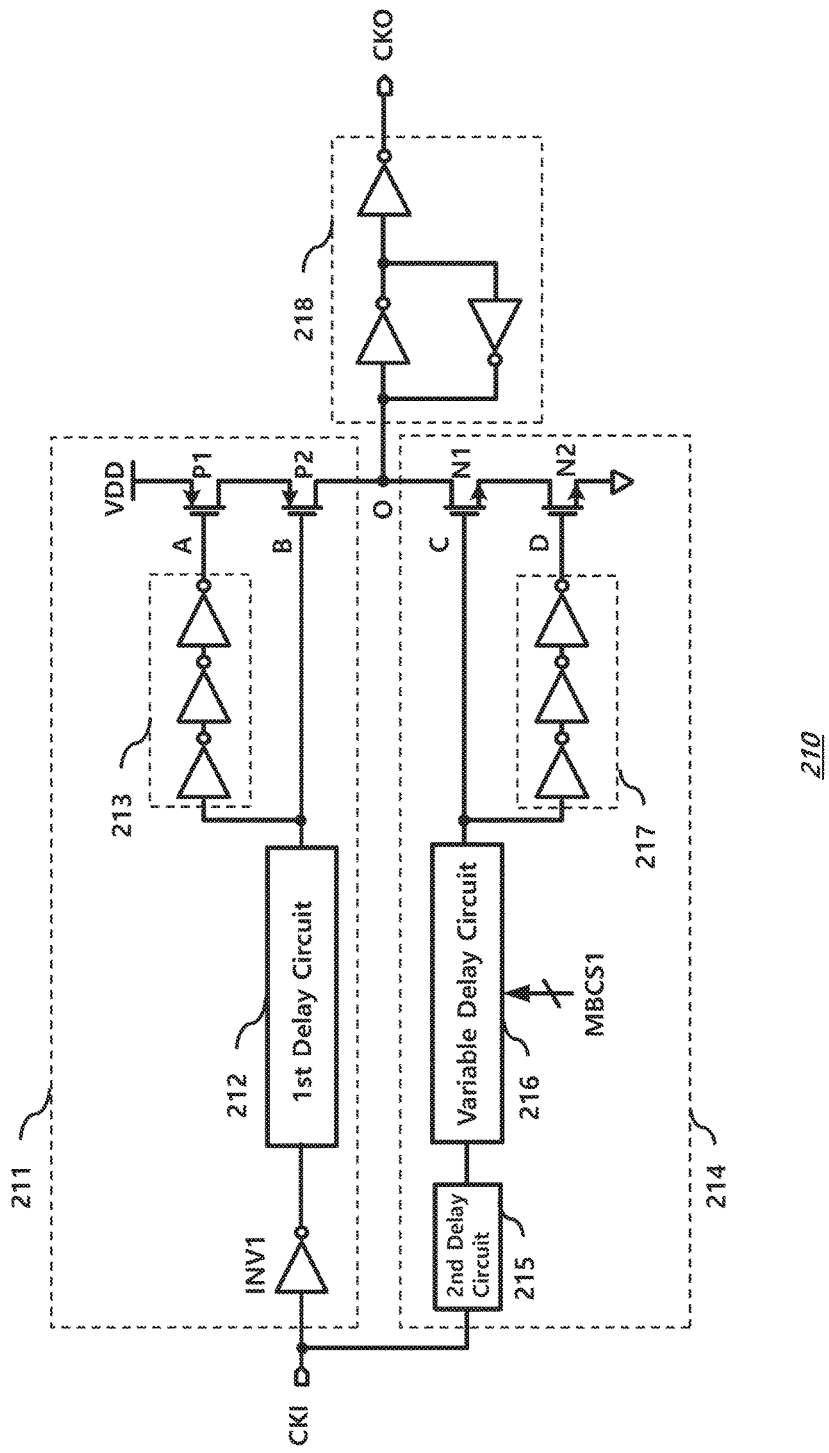
FIG. 4 is a circuit diagram of a duty ratio adjusting circuit of FIG. 1, according to an embodiment.

FIG. 4 shows a circuit of the first duty ratio adjusting circuit 210 of FIG. 1, according to an embodiment.

The first duty ratio adjusting circuit 210 includes a rising edge generating circuit 211 for generating a rising edge in accordance with an input clock CKI, a falling edge generating circuit 214 for generating a falling edge in accordance with the input clock CKI, and an output circuit 218 for latching and outputting the output signals of the rising edge generating circuit 211 and the falling edge generating circuit 214.

The rising edge generating circuit 211 includes an inverter INV1 for inverting the input clock CKI, a first delay circuit 212 for delaying the output of the inverter INV1, a first inverting delay circuit 213 for inverting and delaying the output of the first delay circuit 212, and a first PMOS transistor P1 and a second PMOS transistor P2 connected in series between a power supply terminal VDD and an output terminal 0.

The gate A of the first PMOS transistor P1 is controlled by the output of the first inverting delay circuit 213 and the gate B of the second PMOS transistor P2 is controlled by the output of the first delay circuit 212.

The falling edge generating circuit 214 includes a second delay circuit 215 for delaying the input clock CKI, a variable delay circuit 216 for variably delaying the output of the second delay circuit 215 under the control of the first multi-bit control signal MBCS1 output by the first control circuit 310, a second inverting delay circuit 217 for inverting and delaying the output of the variable delay circuit 216, a first NMOS transistor N1 and a second NMOS transistor N2 connected in series between the output stage O and the ground.

The gate C of the first NMOS transistor N1 is controlled by the output of the variable delay circuit 216 and the gate D of the second NMOS transistor N2 is controlled by the output of the second inversion delay circuit 217.

Figure 5:
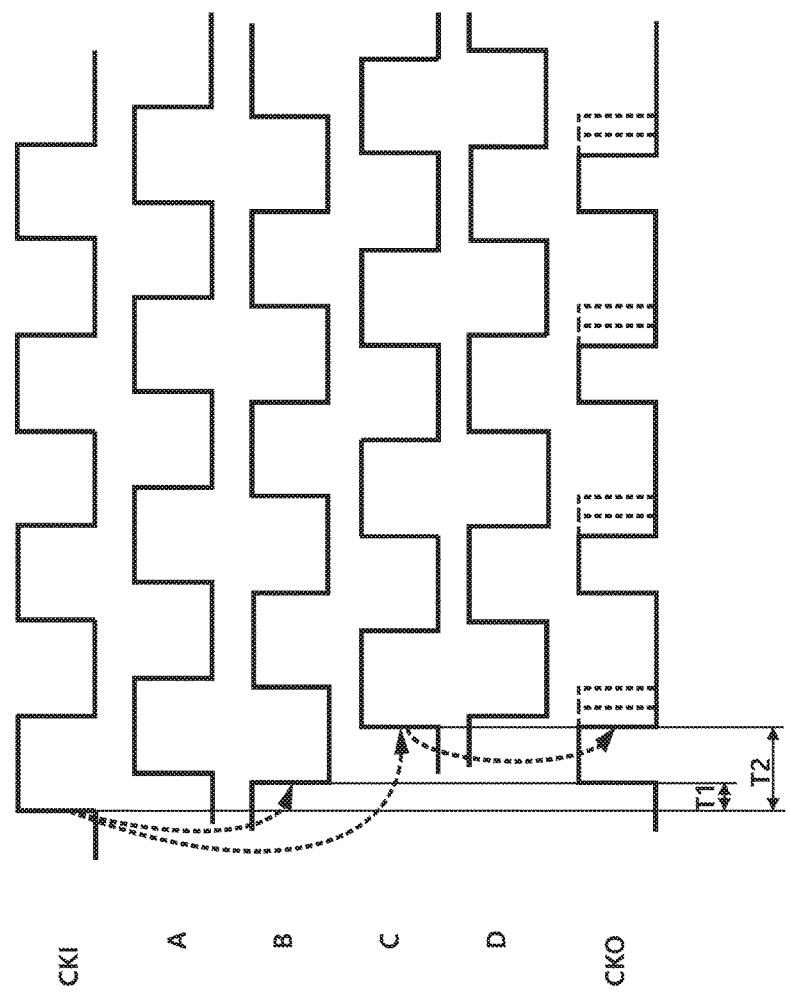
FIG. 5 is a timing diagram showing the operation of the duty ratio adjusting circuit of FIG. 4, according to an embodiment.

FIG. 5 is a timing diagram showing the operation of FIG. 4, according to an embodiment.

In FIG. 5, the delay amount of the output section 218 is ignored.

The rising edge of the output clock CK0 occurs when the nodes A and B are all at the low level and the falling edge occurs when the nodes C and D are all at the high level.

Since the delay amount of the first delay circuit 212 is fixed in this embodiment, the time when the rising edge is generated is determined by the delay, which corresponds to T1 in FIG. 5, in the inverter INV1, the first delay circuit 212, the first inverting delay circuit 213 and the buffer section 218.

The time when the rising edge of the falling edge occurs is delayed from the rising edge of the input clock CKI by the delay, which corresponds to T2 in FIG. 5, in the second delay circuit 215, the variable delay circuit 216, the second inversion delay circuit 217 and the buffer circuit 218.

Since the delay amount of the variable delay circuit 216 is varied according to the control signal provided by the first control circuit 310, the time at which the falling edge occurs is adjusted according to the first multi-bit control signal MBCS1 provided by the first control circuit 310.

In FIG. 5, the falling edge of the output clock CK0 is indicated by a dotted line, indicating that the time at which the falling edge is generated under the control of the first control circuit 310 is controlled. Accordingly, the duty ratio of the output clock CK0 is adjusted.

The second duty ratio adjusting circuit 220 may be configured to be substantially the same as the first duty ratio adjusting circuit 210. Accordingly, the duty ratio of the output clock of the second duty ratio adjusting circuit 220 may be controlled in accordance with the output of the first control circuit 310.

Figure 6:
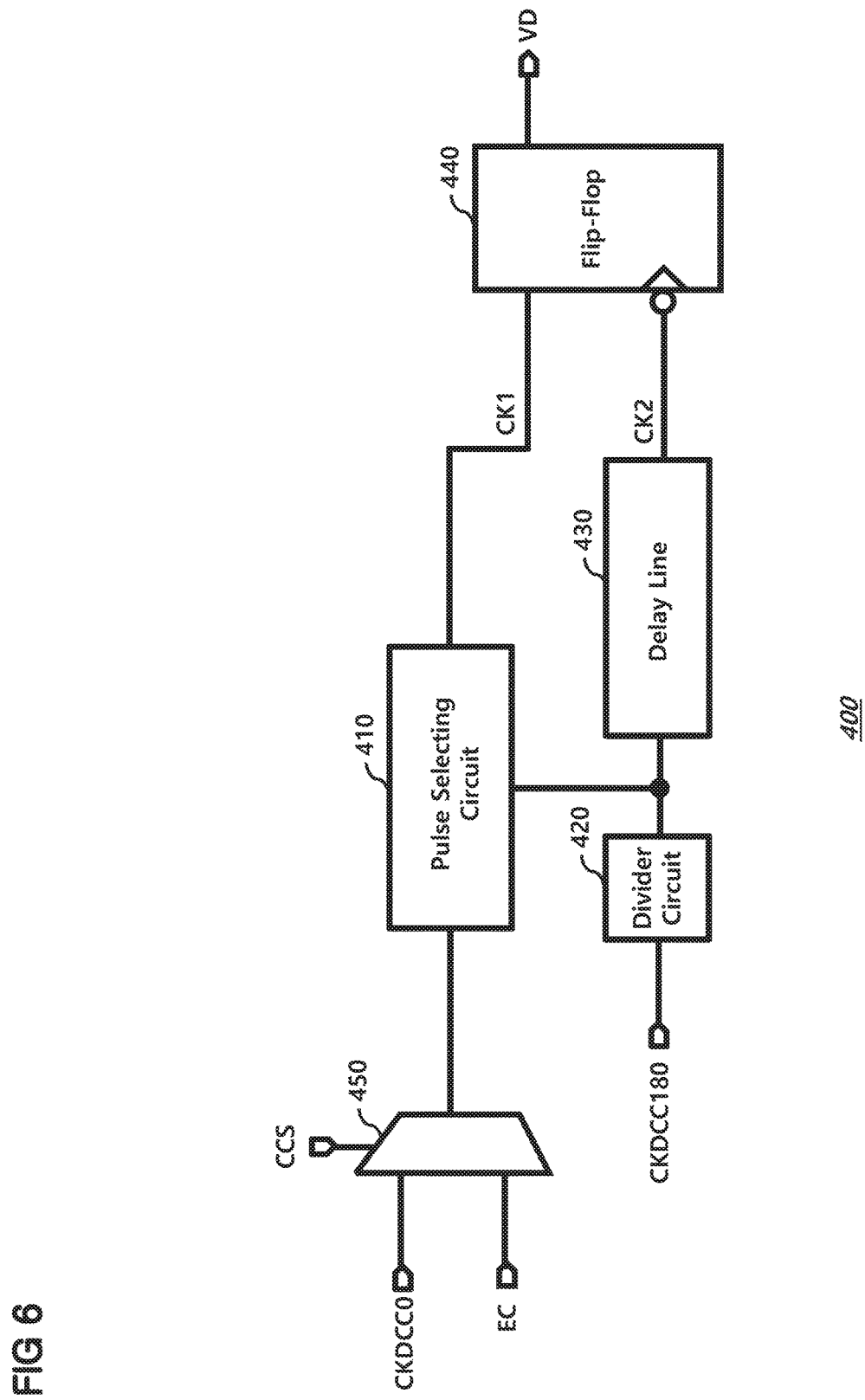
FIG. 6 is a circuit diagram of a duty ratio detecting circuit of FIG. 1, according to an embodiment.

FIG. 6 is a block diagram of the duty ratio detecting circuit 400 of FIG. 1, according to an embodiment.

The duty ratio detecting circuit 400 includes a pulse selecting circuit 410, a divider circuit 420, a delay line 430, a flip-flop 440, and an input selecting circuit 450.

The input selecting circuit 450 selects the output of the first output clock CKDCC0 or the output EC of the edge combining circuit 600 according to the completion signal CCS output by the first control circuit 310.

As described above, the output of the first control circuit 310 indicates whether the control operation of the first control circuit 310 is completed.

When the completion signal CCS indicates that the control operation of the first control circuit 310 is not completed, the input selecting circuit 450 selects the first output clock CKDCC0 to perform the duty ratio correction operation. When the completion signal CCS indicates that the control operation of the first control circuit 310 is completed, the input selecting circuit 450 selects the output EC of the edge combining circuit 600.

The pulse selecting circuit 410 delays the input signal by the width of the high-level interval of the input signal to output the first clock CK1.

The divider 420 divides the third output clock CKDCC180 by ½. The divided signal naturally has a duty ratio fixed at 50%, which is used as the reference clock signal.

The delay line 430 delays the reference clock signal by the delay time at the pulse selecting circuit 410 and outputs the second clock CK2.

The flip-flop 440 samples the first clock CK1 at the falling edge of the second clock CK2.

The duty ratio detecting circuit 400 of FIG. 6 outputs an output signal VD having a logic level of 1 if the duty ratio of the clock signal input to the pulse selecting circuit 410 is equal to or larger than 50% and having a logic level of 0 if the duty ratio is less than 50%.

Figure 7:
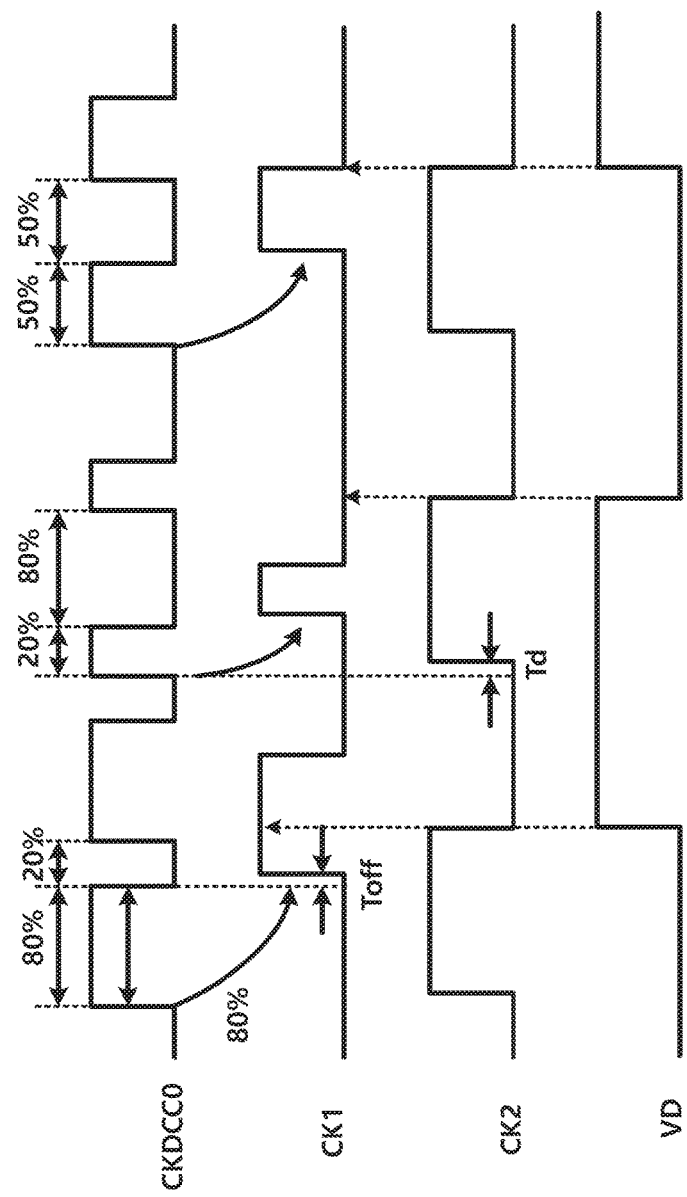
FIG. 7 is a timing diagram showing the operation of the duty ratio detecting circuit of FIG. 6.

FIG. 7 is a timing diagram illustrating the operation of the duty ratio detecting circuit 400 of FIG. 6, according to an embodiment.

FIG. 7 shows an embodiment in which the first output clock CKDCC0 is selected as the input clock. Hereinafter, the first output clock CKDCC0 is referred to as an input clock.

The first clock CK1 is delayed by the width of the pulse having the high level of the input clock by the operation of the pulse selecting circuit 410 and further delayed by the delay Toff inherent in the pulse selecting circuit 410.

The second clock CK2 is generated by dividing third output clock CKDCC180 by ½ and delaying the divided signal. The duty ratio is fixed at 50%.

The delay amount Td of the delay line 430 is determined so as to compensate the delay amount Toff in the pulse selecting circuit 410.

The flip-flop 440 samples the first clock CK1 at the falling edge of the second clock CK2.

As shown in FIG. 7, when the duty ratio of the input clock exceeds 50%, the output signal VD of the flip-flop 440 has a level of 1 and the output of the flip-flop 440 has a level of 0 otherwise.

Figure 8:
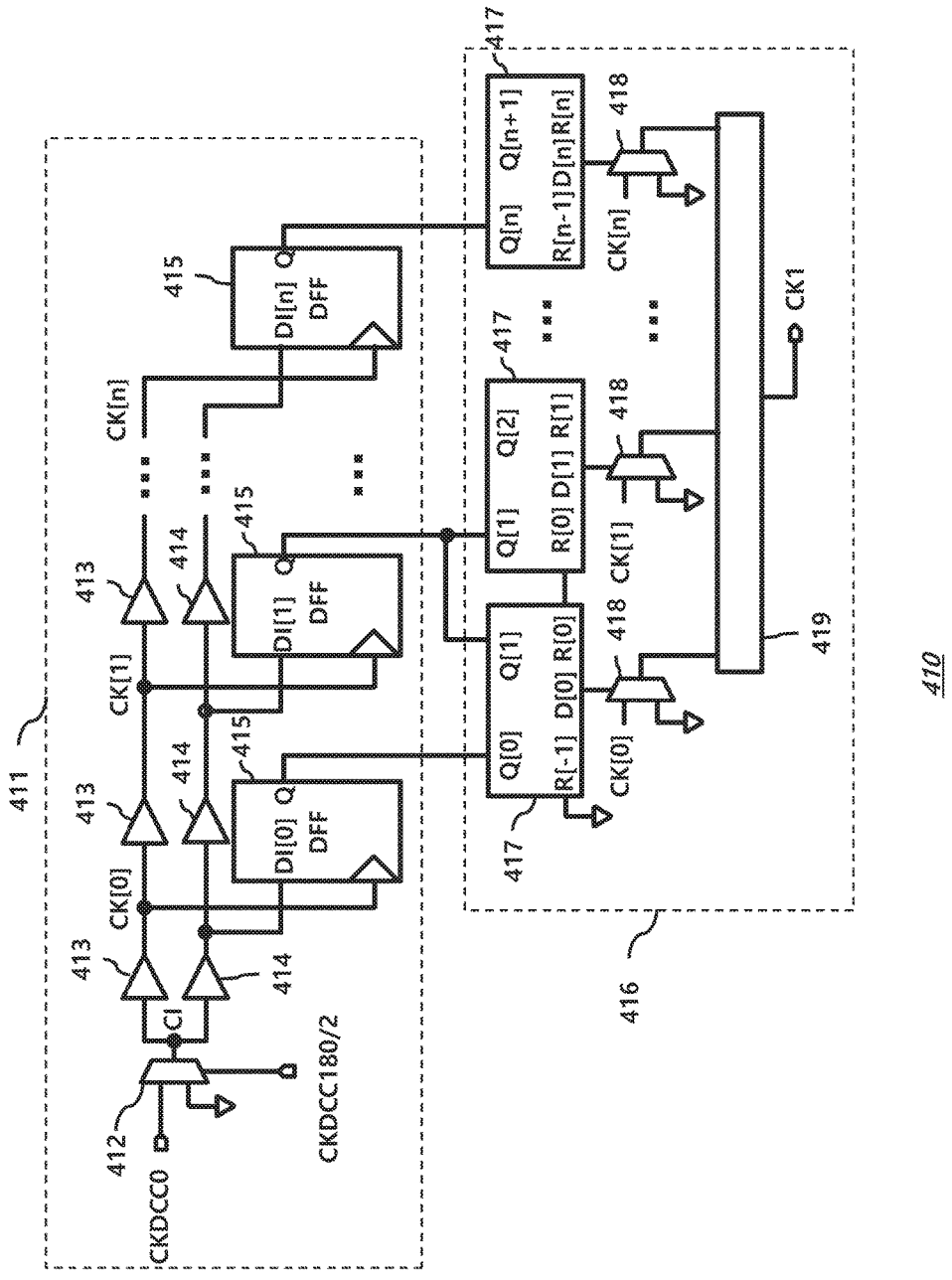
FIG. 8 is a circuit diagram of the pulse selector of FIG. 6, according to an embodiment.

FIG. 8 is a circuit diagram of the pulse selecting circuit 410 of FIG. 6, according to an embodiment.

It is assumed that the first output clock CKDCC0 is selected as the input clock CI in the pulse selecting circuit 410 of FIG. 6.

The pulse selecting circuit 410 includes a Time-to-Digital Converter (TDC) 411 and a clock selection circuit 416.

TDCs are a well-known class of circuits that measures time intervals and generates corresponding digital signals.

The TDC 411 includes an input selector 412 for selecting the input clock CKDCC0 for one cycle of the reference clock CKDCC180/2, a plurality of first buffers 413 and a plurality of second buffers 414 for sequentially delaying the output of the input selector 412.

In this embodiment, the delay time of each of the first buffers 413 is t1 and the delay time of each of the second buffers 414 is t2 (t1>t2).

The plurality of first buffers 413 outputs a plurality of clock signals CK[0:n] respectively delaying the input clock CI by a plurality of times t1, 2×t1, . . . , (n+1)×t1. The plurality of second buffers 414 provides a plurality of signals to inputs DI[0:n] of a plurality of flip-flops 415 delaying the input clock CI by a plurality of times t2, 2×t2, . . . , (n+1)×t2, respectively.

The TDC 411 includes the plurality of flip-flops 415 for respectively sampling the outputs of the second buffers 414 in accordance with the outputs of the first buffers 413.

Figure 10:
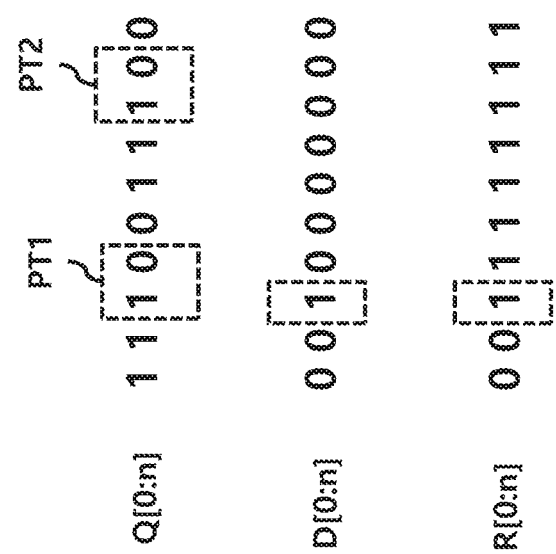
FIG. 10 is a diagram illustrating the operation of the selection logic circuit of FIG. 6.

FIG. 10 shows the outputs Q[0:n] of the flip-flops 415 of FIG. 8.

A section in which 1 is continuous in the outputs Q[0:n] of the flip-flops 415 corresponds to a section in which the input clock CI is at a high level.

The pulse selecting circuit 410 needs to detect the first point PT1 where the outputs Q[0:n] of the flip-flops 415 changes from 1 to 0 in order to delay the input clock CI by the width of the interval in which the input clock CI is at the high level.

The second point PT2 where the outputs of the flip-flop 415 again change from 1 to 0 may be ignored.

The clock selection circuit 416 of FIG. 8 detects the first point PT1 where the output of the flip flop 415 changes from 1 to 0 and selects a clock signal among clock signals CK[0:n] delayed by the first buffer 413 corresponding to the detected point.

The clock signal CK1 thus output corresponds to a clock whose input clock CI is delayed by the width of the interval in which the input clock is at the high level.

The clock selection circuit 416 of FIG. 8 includes a plurality of logic blocks 417 for detecting the point where the output of the flip flop 415 changes from 1 to 0, a plurality of selecting circuits 418 for respectively selecting one of a plurality of clock signals CK[0:n], and a logic circuit 419 for outputting a signal selected by the selecting circuits 418 as a first clock CK1.

In this embodiment, the $i^{th}$ logic block 417 can output the selection signal D[i] and the reset signal R[i].

The reset signal R[i] is activated when the output of the corresponding one of the flip-flops 415 changes from 1 to 0 for the first time, and indicates that subsequent changes of the outputs of the flip-flops 415 from 1 to 0 may be ignored.

Referring to FIG. 10, the reset signal R[i] output from one of the logic blocks 417 is activated immediately before the output of the corresponding flip-flop 415 changes from 1 to 0, and remains active after that (that is, is activated by all subsequent logic blocks 417. That is, if an $i^{th}$ flip flop 415 has an output equal to one (1) and the $i+1^{th}$ flip flop 415 has an output equal to zero (0), or if the $i-1^{th}$ reset signal R[i−1] has a value of one (1), the reset signal R[i] of the $i^{th}$ logic block 415 will have a value of one (1).

It can be seen that the selection signal D[i] output from one the logic block 417 is activated immediately before the output of the corresponding flip-flop 415 changes from 1 to 0 under the condition that the previous reset signal is at 0. That is, if an $i^{th}$ flip flop 415 has an output equal to one (1), the $i+1^{th}$ flip flop 415 has an output equal to zero (0), and the $i-1^{th}$ reset signal R[i−1] has a value of zero (0), the selection signal D[i] of the $i^{th}$ logic block 415 will have a value of one (1).

Accordingly, only one of the plurality of selectors 418 outputs a clock signal (any one of CK[i], i=0, 1, . . . , n), and the other outputs 0.

Figure 9:
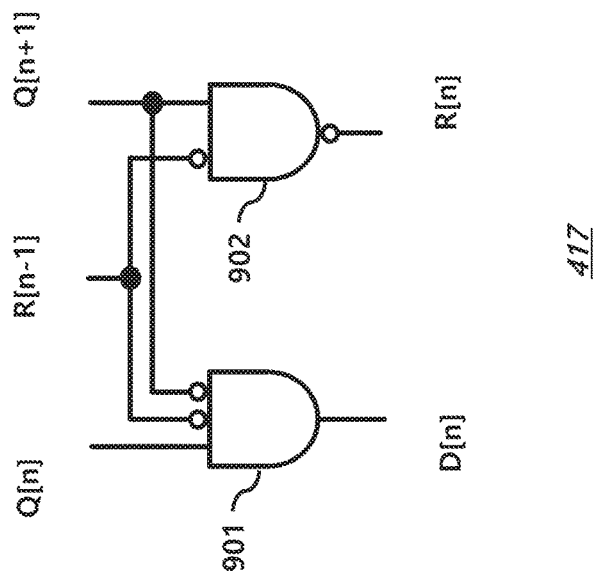
FIG. 9 is a circuit diagram of the select logic circuit of FIG. 8, according to an embodiment.

FIG. 9 is a circuit diagram showing the operation of the logic block 417 at the gate level, according to an embodiment. The logic block 417 includes a first gate 901 and a second gate 902.

The first gate 901 activates a selection signal D[n] under the condition that the output signal Q[n] of the current flip-flop is activated, the reset signal R[n−1] of the previous stage is inactivated, and the output Q[n+1] of the next stage flip-flop is inactivated.

The second gate 902 activates a reset signal R[n] under the condition that the reset signal R[n−1] of the previous stage is activated or the output Q[n+1] of the flip-flop of the next stage is inactivated.

In this embodiment, the logic circuit 419 of FIG. 8 performs an OR operation on the signals generated by the plurality of selectors 418 and outputs the result.

Figure 11:
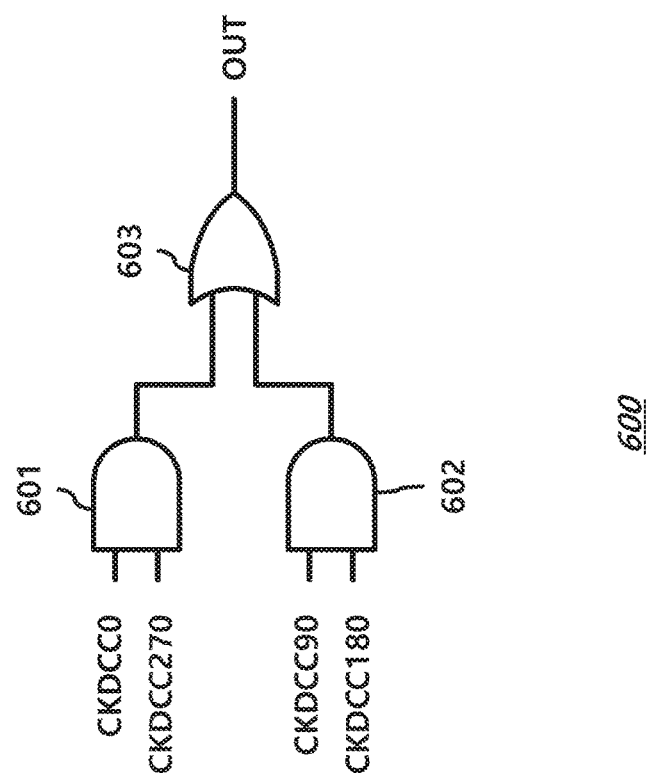
FIG. 11 is a circuit diagram of an edge combining circuit of FIG. 1, according to an embodiment.
Figure 12:
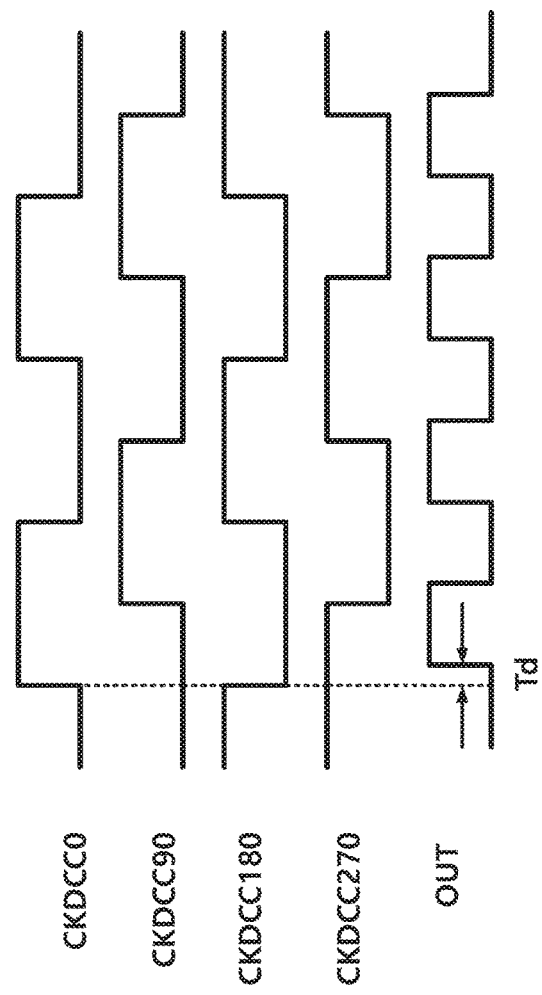
FIG. 12 is a timing diagram showing the operation of the edge combining circuit of FIG. 11.

FIG. 11 is a logic diagram showing the edge combing circuit 600, and FIG. 12 is a timing diagram showing the operation of the edge combining circuit 600 of FIG. 11.

The edge combining circuit 600 forms an output signal OUT having a rising edge generated at the rising edge of the first output clock CKDCC0 and the third output clock CKDCC270 and having a falling edge generated at the rising edge of the second output clock CKDCC90 and the fourth output clock CKDCC270.

Thus, the frequency of the output of the edge combining circuit 600 is as twice as that of the first to fourth output clocks.

The edge combining circuit 600 includes a gate 601 for performing AND operation on the first output clock CKDCC0 and the fourth output clock CKDCC270 and a gate 602 for performing AND operation on the second output clock CKDCC90 and the third output clock CKDCC 180, and a gate 603 for performing OR operation on the outputs of the two gates 601 and 602.

In FIG. 12, a delay Td due to gate delay is indicated between the first output clock CKDCC0 and the output signal OUT.

Assuming that the duty ratios of the first through fourth output clocks are all corrected to 50% by the first duty ratio adjusting circuit 210 and the second duty ratio adjusting circuit 220, the duty ratio of the output of the edge combining circuit 600 may be a value deviated from 50% according to the phase difference between the first output clock CKDCC0 and the second output clock CKDCC90.

Accordingly, in the phase correction operation after the duty correction operation is completed, the output of the edge combining circuit 600 is input to the duty ratio detecting circuit 400, and the delay amount of the variable delay line 120 is adjusted according to the result, so that the duty ratio of the output of the edge combining circuit 600 is corrected.

As a result, duty ratio correction and phase correction of the multi-phase clock signals are accomplished.

Although various embodiments have been described for illustrative purposes, it will be apparent to those skilled in the art that various changes and modifications may be made without departing from the spirit and scope of the invention as defined in the following claims.

What is claimed is:

1. A device for correcting a multi-phase clock signal, the device comprising:
   a first duty ratio adjusting circuit configured to adjust a duty ratio of a first clock signal having a first phase;
   a variable delay line configured to variably delay a second clock signal having a second phase;
   a second duty ratio adjusting circuit configured to adjust a duty ratio of an output of the variable delay line;
   a first differential clock generating circuit configured to generate a first differential signal from an output of the first duty ratio adjusting circuit;
   a second differential clock generating circuit configured to generate a second differential signal from an output of the second duty ratio adjusting circuit;
   an edge combining circuit configured to combine edges of signals output from the first differential clock generating circuit and the second differential clock generating circuit;
   a duty ratio detecting circuit configured to detect a duty ratio of either an output from the first duty ratio adjusting circuit or an output from the first differential clock generating circuit when in a duty ratio correction mode and configured to detect a duty ratio of an output from the edge combining circuit when in a phase correction mode;
   a first control circuit configured to control the first duty ratio adjusting circuit and the second duty ratio adjusting circuit in accordance with an output of the duty ratio detecting circuit when the duty ratio detecting circuit is in the duty ratio correction mode; and
   a second control circuit configured to control the variable delay line in accordance with an output of the duty ratio detecting circuit when the duty ratio detecting circuit is in the phase correction mode.

2. The device of claim 1, further comprising:
   a dummy delay line configured to delay the first clock signal having the first phase.

3. The device of claim 1, wherein the duty ratio correction mode precedes the phase correction mode and the first control circuit controls the duty ratio detecting circuit to perform the phase correction mode when a control signal indicates the duty correction mode.

4. The device of claim 3, wherein the duty ratio detecting circuit comprises an input selecting circuit configured to select one of an output from the first duty ratio adjusting circuit or an output from the first differential clock generating circuit when the control signal generated by the first control circuit indicates the duty ratio correction mode, and configured to select an output from the edge combing circuit when the control signal generated by the first control circuit indicates a mode other than the duty ratio correction mode.

5. The device of claim 4, wherein the duty ratio detecting circuit is configured to outputs a signal whose level is determined by comparing a duty ratio of an output from the input selecting circuit with a reference duty ratio.

6. The device of claim 5, wherein the reference duty ratio is 50%.

7. The device of claim 4, wherein the duty ratio detecting circuit comprises:
   a pulse selecting circuit configured to delay a signal output from the input selecting circuit according to a reference clock by an interval corresponding to a duration of high level of the signal from the input selecting circuit; and
   a flip-flop configured to sample an output from the pulse selecting circuit according to the reference clock signal.

8. The device of claim 7, wherein the pulse selecting circuit comprises:
   a Time to Digital Converter (TDC) circuit configured to generate a plurality of output clocks by delaying a signal output from the input selecting circuit for a plurality of delay times and to output a multi-bit digital signal indicating a high-level interval or a low-level interval of the signal output from the input selecting circuit; and
   a clock selection circuit configured to select a signal among the plurality of output clocks according to the multi-bit digital signal.

9. The device of claim 8, wherein the TDC circuit further comprises a selector configured to receive a signal output from the input selecting circuit for a half-period of the reference clock signal.

10. The device of claim 7, wherein the reference clock signal is generated by dividing an output from the first differential clock generating circuit by ½.

11. The device of claim 10, further comprising:
    a delay line configured to delay the reference clock signal and to provide a delayed signal as a clock signal of the flip-flop.

12. The device of claim 1, wherein the first duty ratio adjusting circuit comprises:
    a rising edge generating circuit configured to generate a rising edge after a first delay time from a rising edge of an input signal; and
    a falling edge generating circuit configured to generate a falling edge after a second delay time from a falling edge of the input signal, wherein the second delay time is adjusted by the first control circuit.

13. The device of claim 12, wherein the first duty ratio adjusting circuit further comprise an output circuit configured to receive and latch an output from the rising edge generating circuit and an output from the falling edge generating circuit.

14. The device of claim 1, wherein the second duty ratio adjusting circuit comprises
    a rising edge generating circuit configured to generate a rising edge after a first delay time from a rising edge of an input signal; and
    a falling edge generating circuit configured to generate a falling edge after a second delay time from a falling edge of the input signal,
    wherein the second delay time is adjusted by the first control circuit.

15. The device of claim 14, wherein the first duty ratio adjusting circuit further comprise an output circuit configured to receive and latch an output from the rising edge generating circuit and an output from the falling edge generating circuit.

16. The device of claim 1, wherein one or more of the first control circuit and the second control circuit comprise a Successive Approximation Register.

17. The device of claim 16, further comprising:
a control clock generating circuit configured to generate a control clock according to an output from the second duty ratio generating circuit and to provide the control clock to one or more of the first control circuit and the second control circuit.

18. The device of claim 1, wherein a phase difference between the first phase and the second phase is 90 degrees.

19. The device for correcting multi-phase clock signal of claim 18, wherein the first differential clock generating circuit is configured to generate a first output clock and a third output clock and the second differential clock generating circuit is configured to generate a second output clock and a fourth output clock.

20. The device of claim 19, wherein the edge combing circuit comprises
a first AND gate performing an AND operation on the first output clock and the fourth output clock;
a second AND gate performing an AND operation on the second output clock and the third output clock; and
an OR gate performing an OR operation on the respective outputs of the first AND gate and the second AND gate.

* * * * *